US010483960B2

(12) United States Patent
Li

(10) Patent No.: US 10,483,960 B2
(45) Date of Patent: Nov. 19, 2019

(54) RADIO FREQUENCY SWITCH WITH LOW OXIDE STRESS

(71) Applicant: Skyworks Solutions, Inc., Woburn, MA (US)

(72) Inventor: Qiang Li, Irvine, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 16/154,304

(22) Filed: Oct. 8, 2018

(65) Prior Publication Data

US 2019/0052256 A1 Feb. 14, 2019

Related U.S. Application Data

(63) Continuation of application No. 14/808,898, filed on Jul. 24, 2015, now Pat. No. 10,097,171.

(60) Provisional application No. 62/029,344, filed on Jul. 25, 2014.

(51) Int. Cl.
*H03K 17/06* (2006.01)
*H03K 17/14* (2006.01)
*H03K 17/041* (2006.01)
*H03K 17/687* (2006.01)
*H01L 21/8238* (2006.01)
*H01L 29/66* (2006.01)
*H03K 17/693* (2006.01)

(52) U.S. Cl.
CPC ..... *H03K 17/04106* (2013.01); *H03K 17/687* (2013.01); *H03K 17/693* (2013.01)

(58) Field of Classification Search
CPC .......... H03K 17/04106; H03K 17/687; H03K 19/0175; H03K 19/094; H04B 1/44
USPC .................................................. 327/365–508
See application file for complete search history.

(56) References Cited

U.S. PATENT DOCUMENTS

| 6,559,703 B1* | 5/2003 | Kwong ................ H03K 17/165 327/313 |
| 7,372,301 B2* | 5/2008 | Fukuoka ............... G06F 1/3203 326/31 |
| 7,710,189 B2* | 5/2010 | Toda .................. H03K 17/6871 327/427 |
| 8,854,111 B2* | 10/2014 | Chih-Sheng ......... H03K 17/693 327/407 |
| 2006/0267666 A1* | 11/2006 | Toda .................. H03K 17/6871 327/427 |
| 2008/0136495 A1* | 6/2008 | Cornelissens ........ H03K 17/687 327/427 |
| 2008/0218213 A1* | 9/2008 | Kobayashi ....... H03K 19/01852 326/81 |

(Continued)

*Primary Examiner* — Brandon S Cole
(74) *Attorney, Agent, or Firm* — Stetina Brunda Garred & Brucker

(57) ABSTRACT

A RF switch circuit includes a voltage divider circuit and a semiconductor device. The semiconductor device has an activated state and a deactivated state. The voltage divider circuit has an input terminal connected to a first line and an output terminal connected to a second line. The first line is connected to a power source. A gate terminal of the semiconductor device is connected to the second line. In the activated state, a source terminal and a drain terminal of the semiconductor device are each selectively connected to ground. In the deactivated state, the source terminal and the drain terminal of the semiconductor device are each selectively connected to the power source.

20 Claims, 3 Drawing Sheets

(56) References Cited

U.S. PATENT DOCUMENTS

| | | | |
|---|---|---|---|
| 2010/0207679 A1* | 8/2010 | Okashita | H03K 17/04123 327/436 |
| 2014/0062577 A1* | 3/2014 | Chih-Sheng | H03K 17/693 327/427 |
| 2014/0084997 A1* | 3/2014 | Simmonds | H01L 25/00 327/564 |
| 2015/0318852 A1* | 11/2015 | Hoogzaad | H03K 17/687 327/434 |

* cited by examiner

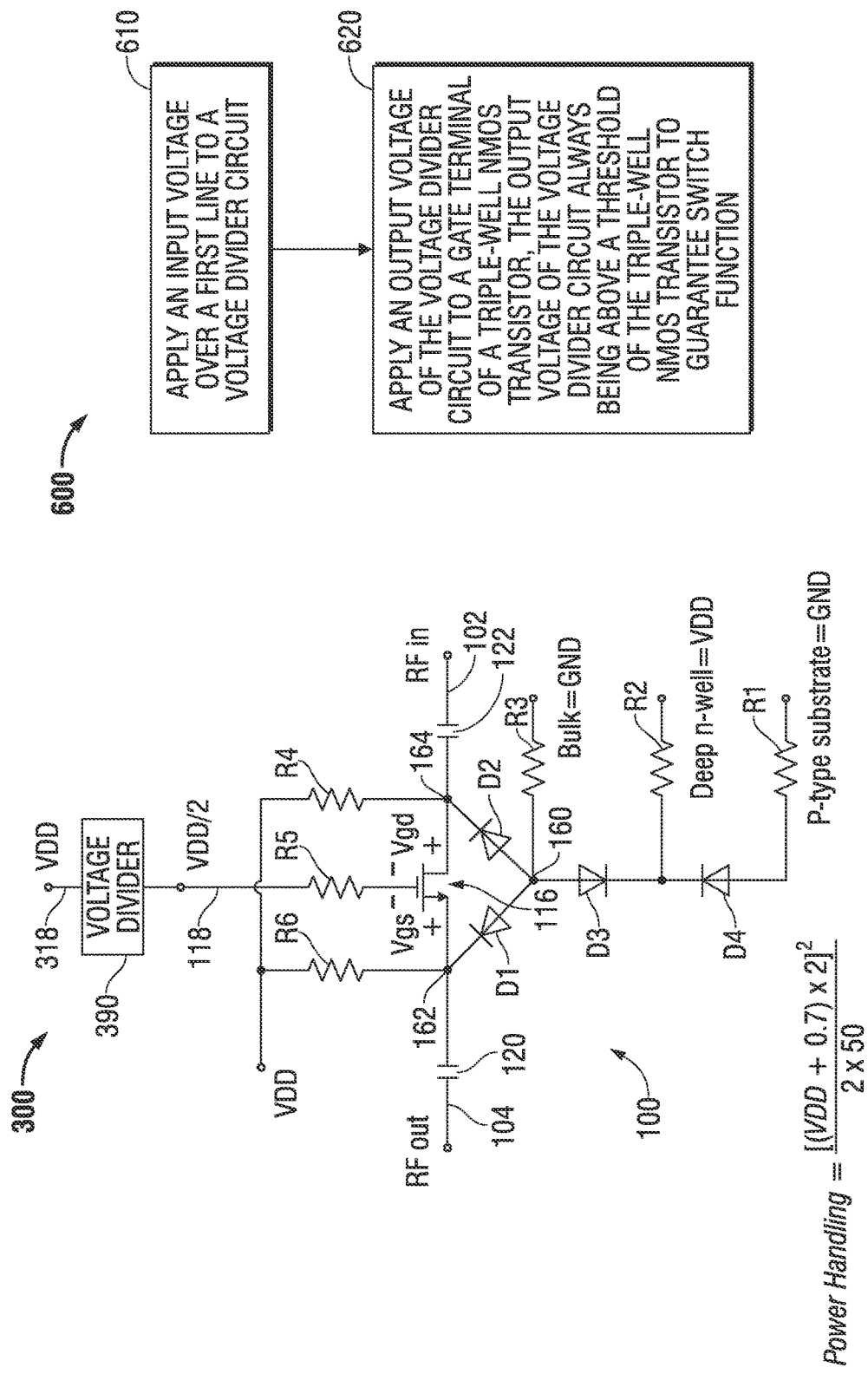

RADIO FREQUENCY SWITCH WITH LOW OXIDE STRESS

CROSS-REFERENCE TO RELATED APPLICATIONS

This application is a continuation patent application of U.S. patent application Ser. No. 14/808,898 filed Jul. 24, 2015 and entitled "RADIO FREQUENCY SWITCH WITH LOW OXIDE STRESS," which relates to and claims the benefit of U.S. Provisional Application No. 62/029,344, filed Jul. 24, 2014 and entitled "RADIO FREQUENCY SWITCH WITH LOW OXIDE STRESS," the entirety of each of the disclosures of which are wholly incorporated by reference herein.

STATEMENT RE: FEDERALLY SPONSORED RESEARCH/DEVELOPMENT

Not Applicable

BACKGROUND

1. Technical Field

The present disclosure generally relates to the field of electronics. More particularly, the present disclosure relates to radio frequency (RF) switches with low oxide stress.

2. Related Art

High frequency switches are used in wireless communications and radar systems for switching between the transmit (Tx) and receive (Rx) paths, for routing signals to the different blocks in multi-band/standard phones, for RF signal routing in phase shifters used in phased array antennas, etc. The communication frequencies cover a broad range from the below-a-megahertz AM band, to the commercial FM band (88-108 MHz), to various military hand-held radio transceivers up to approximately 400 MHz, and to the cellular frequencies of around 900 MHz and 2.4 GHz. State-of-the-art switch technology uses solid-state semiconductor devices for their integration compatibility and relatively lower manufacturing cost attributed to batch fabrication. With the conventional approach, the wide spectrum of communication frequencies calls for different switch technologies for different frequency applications.

Wireless communication devices may be composed of a transmit chain and a receive chain, with the antenna and the transceiver circuit being a part of both the transmit chain and receive chain. The transmit chain may additionally include a power amplifier for increasing the output power of the generated RF signal from the transceiver, while the receive chain may include a low-noise amplifier for boosting the weak received signal so that information can be accurately and reliably extracted therefrom.

The low-noise amplifier and the power amplifier may together consist of a front-end module or front-end circuit, which also includes an RF switch circuit that selectively interconnects the power amplifier and the low-noise amplifier to the antenna. The connection to the antenna is switchable between the receive chain circuitry (i.e., the low-noise amplifier and the receiver) and the transmit chain circuitry (i.e., the power amplifier and the transmitter). In time domain duplex (TTD) communications systems where a single antenna is used for both transmission and reception, switching between the receive chain and the transmit chain occurs rapidly many times throughout a typical communications session.

The RF switches and the amplifier circuits of the front-end module are typically manufactured as an integrated circuit. In high-power applications such as GSM (Global System for Mobile communications) handsets, WLAN (wireless local area networking) client interface devices and infrastructure devices, the ICs are typically manufactured with a GaAs (gallium arsenide) semiconductor substrate. The SOI (silicon-on-insulator) process has also found use in RF switch circuit applications. Good insertion loss and isolation are possible with both GaAs and SOI processes, but manufacturing costs tend to be higher in comparison to more conventional semiconductor technologies, such as the CMOS (Complementary Metal Oxide Semiconductor) process. There have been attempts to implement RF switches in the CMOS process, but only low power devices have been realized. This is, in part, due to the parasitic capacitance of transistors and low-resistivity substrates of bulk semiconductor wafers used in the CMOS process. Accordingly, high-isolation high-linearity CMOS switches at large RF signal levels have been difficult to achieve.

Several electrical parameters are associated with the performance of RF switch designs, but four are considered to be of fundamental importance to the designer because of their strong interdependence: insertion loss, isolation, switching time and power handling. Insertion loss refers to power loss in the RF switch, and is expressed in dB. It is defined by Pout-Pin (dB), where Pin is the input power applied to the RF switch, and Pout is the power at the output port of the RF switch. Thus, a goal of RF switches is to minimize insertion loss. Isolation is a measure of how effectively a switch is turned off. It refers to the measure of the signal attenuation between the active signal port and the inactive signal port. The main contributing factors include capacitive coupling and surface leakage. Thus, a goal of RF switches is to maximize isolation, which minimizes signal leakage. Return loss generally refers to the amount by which the undesired return (or reflected) transmit signal is attenuated. It refers to the measure of input and/or output matching conditions, and is expressed in dB. Linearity, or power handling capability, is the capability of the RF switch to minimize distortion at high power output levels and is expressed in dBm. It is typically represented by the 1 dB compression point (P1 dB), or the point at which insertion loss is degraded by 1 dB. Thus, a goal of RF switches is to maximize linearity. Switching time is the period of time a switch needs for changing state from "ON" to "OFF" and "OFF" to "ON." This period can range from several microseconds in high-power switches to a few nanoseconds in low-power, high-speed devices.

RF switches are designed to generate as little harmonic distortion as possible. Governmental standards also restrict the output of spurious emissions including those from harmonic distortion to either −70 dBc or 43+10 log(P). Conventional front end circuits, including the RF switch, may be fabricated on a bulk CMOS (complementary metal oxide semiconductor) substrate. However, there is a performance tradeoff between insertion loss and harmonic distortion under large signal operation. Furthermore, because of low mobility, low breakdown voltage, and high substrate conductivity associated with CMOS devices, an RF switch with low insertion loss, high isolation, wide bandwidth, and linearity is difficult to produce.

The main performance characteristics of an RF switch are the insertion loss in the ON-state, the isolation in the OFF-state, the return loss in both states, the power consumption, bandwidth, power handling capability and the linearity. RF switching is presently realized for the greater part with PIN diode and GaAs MESFET, HEMT, JFET or silicon SOI based semiconductor switches. RF switches are used in a variety of applications, such as traditional single pole multi throw switches (e.g., for general purpose switching, band/mode switching and antenna diversity applications), double pole double throw (DPDT) switches and antenna switch modules (ASM). Highly linear band or mode switches are vital for multi-mode and multi-band architectures as mobile phone radios can easily operate in 14 bands or more. Typically single-pole, double-throw (SPDT) or single-pole, three-throw (SP3T) switches are used depending on the number of bands supported.

There is a continuing need in the art for improved RF switches, whether single pole-double throw, single pole-triple throw, dual port-dual throw, or any other switch type. There is a need to provide a circuit arrangement with a RF switch circuit having faster switching time. There is a need for RF switches that can be implemented on CMOS substrates or any other semiconductor technology while minimizing insertion loss and maximizing isolation and linearity. There is a need for silicon RF switches with high power handling capabilities.

BRIEF SUMMARY

The present disclosure is directed to RF switch circuits and methods for configuring and operating semiconductor switches for processing of radio frequency (RF) signals. The presently-disclosed techniques allow the use of standard low-cost silicon technologies (e.g., CMOS) for radio-frequency integrated circuits (RFICs) manufacturing.

According to an aspect of the present disclosure, there is a circuit arrangement comprising a RF switch circuit. The RF switch circuit includes a voltage divider circuit and a semiconductor device. The semiconductor device has an activated state and a deactivated state. The voltage divider circuit has an input terminal connected to a first line and an output terminal connected to a second line. The first line is connected to a power source. A gate terminal of the semiconductor device is connected to the second line. In the activated state, a source terminal and a drain terminal of the semiconductor device are each selectively connected to ground. In the deactivated state, the source terminal and the drain terminal of the semiconductor device are each selectively connected to the power source.

According to another aspect of the present disclosure, there is a method for configuring and operating a semiconductor switch for processing of RF signals. The method includes applying an input voltage over a first line to a voltage divider circuit, and applying an output voltage of the voltage divider over a second line to a gate terminal of a triple-well NMOS transistor. The output voltage of the voltage divider circuit is always above a threshold of the triple-well NMOS transistor to guarantee switch function.

BRIEF DESCRIPTION OF THE DRAWINGS

Objects and features of the presently-disclosed RF switch circuits and methods for configuring and operating semiconductor switches for processing of RF signals will become apparent to those of ordinary skill in the art when descriptions of various embodiments thereof are read with reference to the accompanying drawings, of which:

FIG. 5 is a circuit diagram schematically depicting the power handling capability of the triple-well NMOS transistor of FIG. 4 in accordance with an embodiment of the present disclosure; and FIG. 6 is a flowchart illustrating a method for configuring and operating a semiconductor switch for processing of RF signals in accordance with an embodiment of the present disclosure.

DETAILED DESCRIPTION

Figure 1:
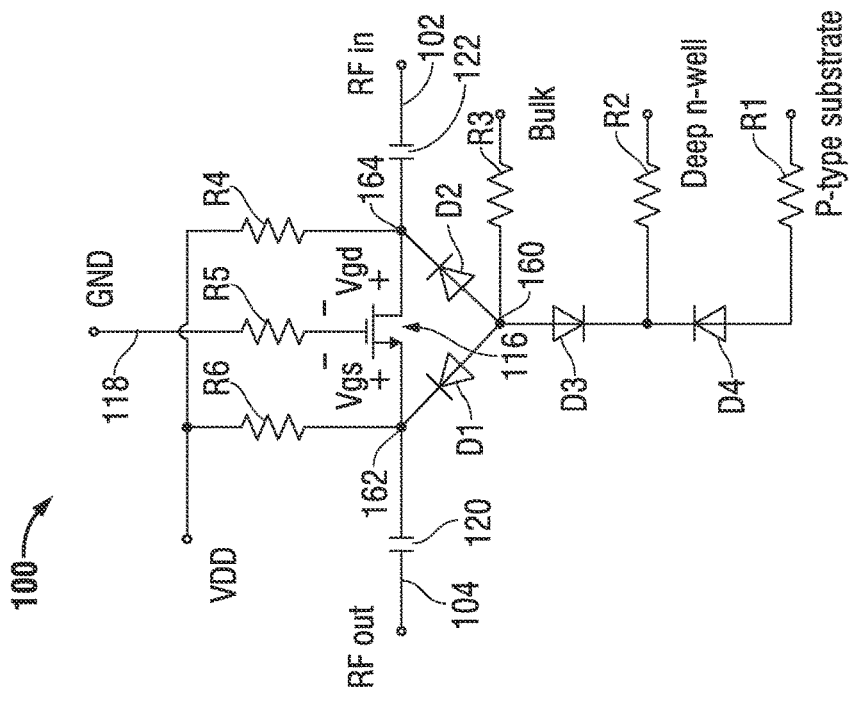
FIG. 1 is a circuit diagram schematically depicting a typical control voltage distribution in a triple-well NMOS transistor, used as an RF switch, for the ON-state.

Hereinafter, embodiments of an RF switch circuit and embodiments of a method for configuring and operating semiconductor switches for processing of RF signals are described with reference to the accompanying drawings. Like reference numerals may refer to similar or identical elements throughout the description of the figures.

This description may use the phrases "in an embodiment," "in embodiments," "in some embodiments," or "in other embodiments," which may each refer to one or more of the same or different embodiments in accordance with the present disclosure.

Various embodiments of the present disclosure provide a method for configuring and operating semiconductor switches for processing of RF signals wherein a relatively low-voltage transistor (e.g., 3.3V transistor) can be used for high-voltage applications (e.g., 5V). Various embodiments of the presently-disclosed method for configuring and operating semiconductor switches for processing of RF signals may provide faster switching time, handle greater power, and keep the device reliable at higher voltages than usual. The presently-disclosed methods for configuring and operating semiconductor switches for processing of RF signals may reduce voltage stress level over gate oxide to half while maintaining the same level of power handling capability.

Referring now to FIG. 1, there is shown a circuit diagram of a circuit 100, which depicts a typical control voltage distribution in a triple-well NMOS transistor 116, used as an RF switch, for the ON-state (also referred to herein as the "activated state").

The NMOS transistor 116 has a gate terminal connected via a resistor R5 to an input line 118. The input line 118 is connected to a power source, e.g., a battery (not shown). The drain terminal is connected to the node 162. The node 162 is connected via a resistor R6 to ground (GND). The source terminal of the NMOS transistor 116 is connected to the node 164. The node 164 is connected via a resistor R4 to ground. A capacitor 122 is coupled between the node 164 and an RF signal input line 102. The capacitor 122 may be a DC blocking capacitor. The circuit 100 also includes parasitic diodes D1, D2 and D3 associated with semiconductor substrate.

As shown in FIG. 1, when the triple-well NMOS transistor 116 is in the activated state, the gate voltage is at VDD, and the drain and source terminals are at ground. In an illustrative non-limiting example where VDD is 5V, the oxide DC stress is Vgs=Vds=5V. This is beyond the limit of, for example, 3.3V devices.

In general, the use of triple-well NMOS transistors reduces circuit and layout complexity. Significantly, having individual NMOS transistors built in separate p-wells in the triple-well scheme allows the variable control of substrate bias. Triple well technology enables application of substrate voltage separately to each transistor and allows the threshold voltage of the transistors to be altered dynamically.

The triple-well technology comprises a buried n-well layer that isolates the p-well from the p-type substrate. The deep n-well in the triple well technology isolates the p-type substrate from the p-well, thus reducing substrate noise coupling. Triple wells can be fabricated in a number of ways. For example, in a p-type substrate having a doping density of $1 \times 10^{16}$ cm$^{-3}$ to $5 \times 10^{16}$ cm$^{-3}$, an n-type implant can be made. Arsenic atoms are typically implanted as opposed to phosphorus, because arsenic diffuses slower than phosphorus and has a better lattice match with silicon. The n-type implant must be deep enough to prevent it from influencing the device behavior of the NMOSFETs that are fabricated in the p-well. Surrounding this buried n-well, using a separate mask, n-type implants are made. This surrounds the NMOS device or a group of devices in the same island. The n-type implant must contact the buried n-type implant, and there should be no p-type layer between the n-type implant and the p-type substrate. Following these steps, a p-type layer is grown epitaxially. This forms the p-well. The MOSFETs are built conventionally in the wells thus formed. If each NMOSFET is built in a separate p-well that is surrounded by the n-type implants, the threshold voltage of each transistor can be controlled individually by adjusting the bias on the p-well.

An alternate method of fabricating triple wells begins by growing a p-layer epitaxially, followed by implanting the n-well. Boron is implanted at a dose between $1 \times 10^{15}$ cm$^{-2}$ and $5 \times 10^{15}$ cm$^{-2}$ at an energy between 2 keV and 10 keV, into a p-type substrate having a doping density between $1 \times 10^{16}$ cm$^{-3}$ to $5 \times 10^{16}$ cm$^{-3}$. A Ge implant preceding this imparts a degree of amorphousness to the substrate, allowing higher dopant concentrations. A mono-crystalline p-type layer is grown epitaxially. This layer is lightly doped, having doping of the same order of magnitude as the substrate. An n-type ion implantation is performed next to form the n-well, and a p-type implantation is performed for the p-well. In the p-well, arsenic is implanted to form a buried n-layer. The n-type buried layer could be made discontinuous by leaving a gap in the layer. This allows a contact between the p-well and the p-type buried implant. The p+ contact to the p-well is made exactly above the gap in the n-layer. The transistors and the well contacts are made using the conventional process. Leaving the gap in the deep n-layer allows the formation of a low-resistance path between the source of the PMOSFET built in the n-well and the p-well through the n-well. This helps in reducing the potential drop along this path, and the chances of latchup are minimized, latchup being a major reliability concern in bulk CMOS technology.

As shown in FIGS. 1 through 5, the resistivity of the p-type substrate is indicated by the resistor R1. The resistivity of the deep n-well is indicated by the resistor R2. The resistivity of the bulk semiconductor is indicated by the resistor R3.

Figure 2:
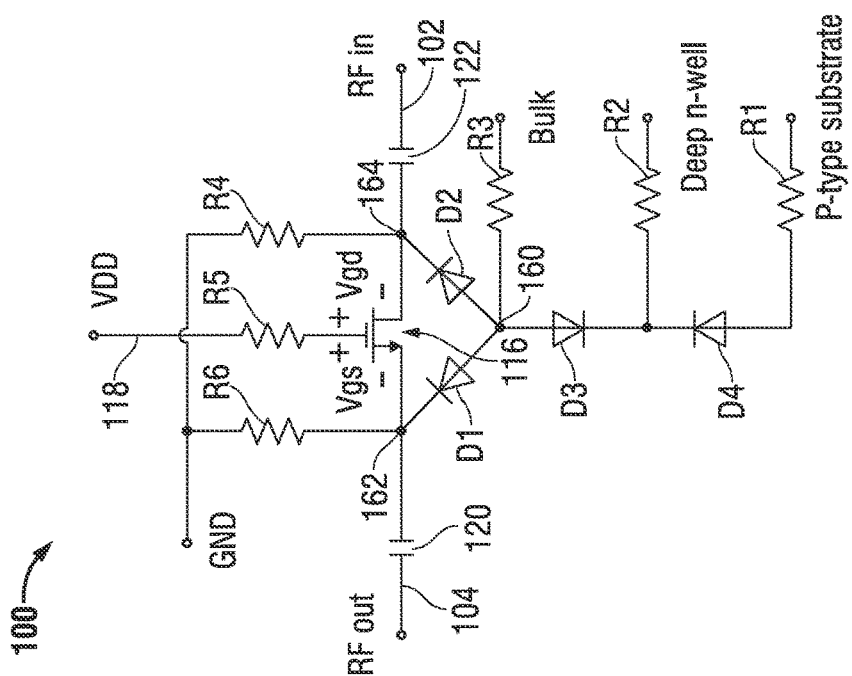
FIG. 2 is a circuit diagram schematically depicting a typical control voltage distribution in the triple-well NMOS transistor of FIG. 1 for the OFF-state.

Referring now to FIG. 2, there is shown the circuit 100 of FIG. 1, depicting a typical control voltage distribution in the triple-well NMOS transistor 116 for the OFF-state (also referred to herein as the "deactivated state"). As shown in FIG. 2, when the triple-well NMOS transistor 116 is in the deactivated state, the gate voltage is at ground (GND), and the drain and source terminals are at VDD. In the illustrative non-limiting example where VDD is 5V, the oxide DC stress is Vgs=Vds=5V. This is beyond the limit of, for example, 3.3V devices.

Figures 3, 4:
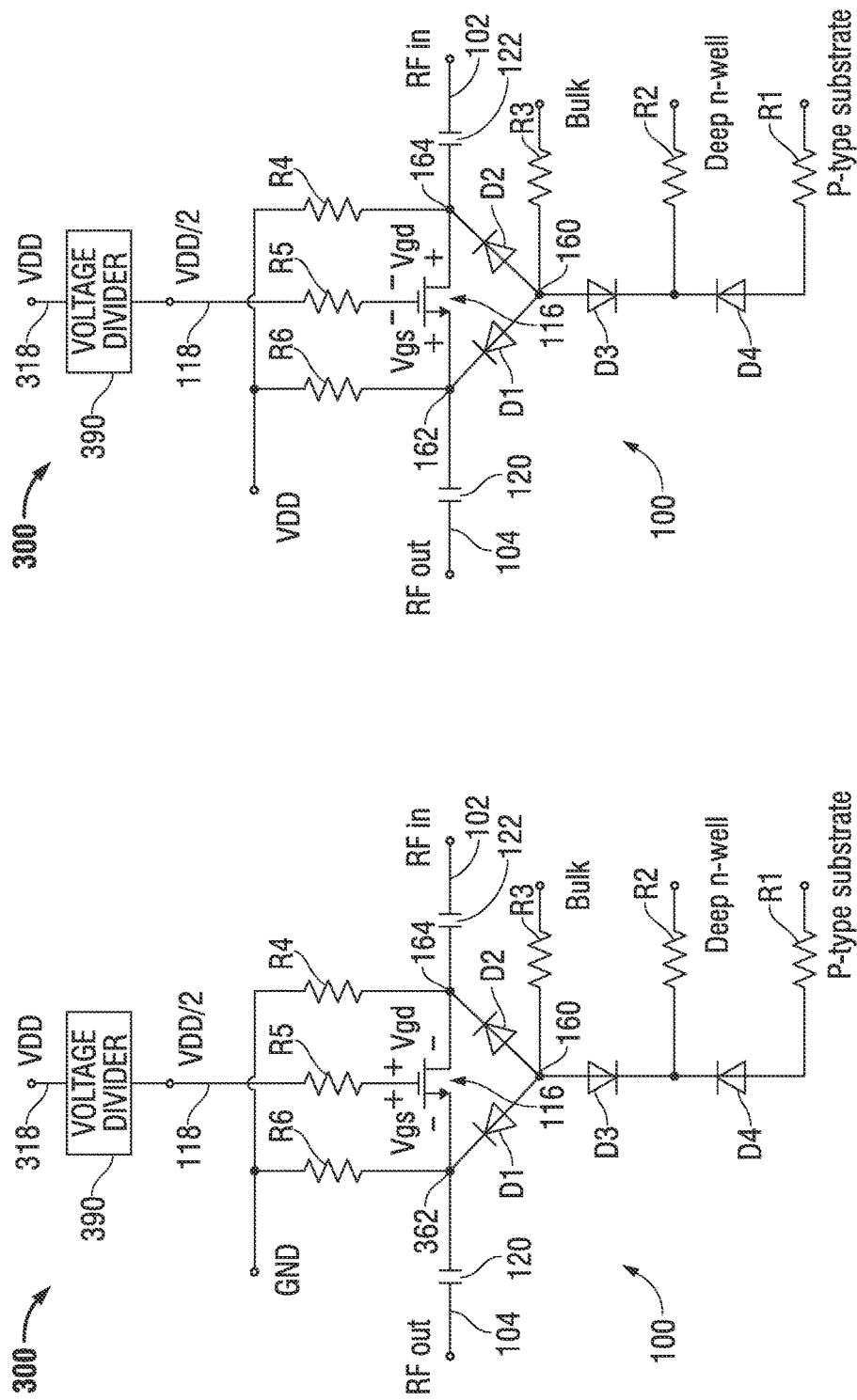
FIG. 3 is a circuit diagram schematically depicting a control voltage distribution in a triple-well NMOS transistor, used as an RF switch, for the ON state, in accordance with an embodiment of the present disclosure.
FIG. 4 is a circuit diagram schematically depicting a control voltage distribution in the triple-well NMOS transistor of FIG. 3 for the OFF state, in accordance with an embodiment of the present disclosure.

Referring now to FIGS. 3 through 5, there is shown a circuit diagram of a circuit 300 in accordance with an embodiment of the present disclosure that includes the circuit 100 having the triple-well NMOS transistor 116. FIG. 3 shows a voltage distribution in the triple-well NMOS transistor 116 for the activated state. FIG. 4 shows a control voltage distribution in the triple-well NMOS transistor 116 for the deactivated state.

The circuit 300 includes a voltage divider circuit 390, which may be a two-resistor voltage divider. It is to be understood that any suitable voltage divider arrangement may be utilized. As shown in FIGS. 3 through 5, the circuit 300 includes a line 318 to an input terminal of the voltage divider circuit 390. The line 318 is connected to a power source, e.g., a battery (not shown).

The circuit 300 includes a line 118 connected between an output terminal of the voltage divider circuit 390 and the gate terminal of the triple-well NMOS transistor 116. As shown in FIG. 3, when the triple-well NMOS transistor 116 is in the activated state, the gate voltage is at VDD/2, and the drain and source terminals are at ground. As shown in FIG. 4, when the triple-well NMOS transistor 116 is in the deactivated state, the gate voltage is at VDD/2, and the drain and source terminals are at VDD. In other words gate terminal voltage may be kept at constant DC voltage in both ON and OFF state of the switch. As mentioned above voltage divider may be resistive with very low current thus having high resistance values. However turn-on and turn-off time of the switch is not compromised.

In the illustrative non-limiting example where VDD is 5V, the oxide DC stress is Vgs=Vds=2.5V. This is within the limit of, for example, 3.3V devices. In accordance with the arrangement shown in circuit 300, VDD/2 is always above the threshold (<1V) of the triple-well NMOS transistor 116.

FIG. 5 shows the power handling capability of the triple-well NMOS transistor 116 in accordance with an embodiment of the present disclosure. The OFF-state sets the RF power handling limit because of parasitic diode (diodes D1, D2, D3) clipping at certain level of induced RF voltage. Vbulk=VRF/2 at node 160 because of capacitor divider (diodes' parasitic capacitance).

Diode clips when Vbulk−Vd (or Vs)>Vth of diode (i.e., 0.7V), and Vd=Vs=Vdd when switch is off. As a result, the power handling can be expressed as set forth, below, in equation 1.

$$\frac{[(VDD + 0.7) \times 2]^2}{2 \times 50} \qquad (1)$$

Thus, using equation 1, when VDD equals 3.6V, power handling=29 dBm.

FIG. 6 shows a flowchart illustrating a method 600 for configuring and operating a semiconductor switch for processing of RF signals in accordance with an embodiment of the present disclosure. At block 610, an input voltage VDD is applied over a first line 318 to a voltage divider circuit 390.

At block 620, an output voltage of the voltage divider circuit 390 is applied over a second line 118 to a gate terminal of a triple-well NMOS transistor 116. The output voltage of the voltage divider circuit 390 is always above a threshold of the triple-well NMOS transistor 116 to guarantee switch function.

In some embodiments, when the triple-well NMOS transistor 116 is in a deactivated state, a source terminal and a drain terminal of the triple-well NMOS transistor 116 are each selectively connected to a power source, the power source being connected to the voltage divider circuit 390 over the first line 318.

In some embodiments, when the triple-well NMOS transistor 116 is in an activated state, a source terminal and a drain terminal of the triple-well NMOS transistor 116 are each selectively connected to ground.

Although embodiments have been described in detail with reference to the accompanying drawings for the purpose of illustration and description, it is to be understood that the disclosed processes and apparatus are not to be construed as limited thereby. It will be apparent to those of ordinary skill in the art that various modifications to the foregoing embodiments may be made without departing from the scope of the disclosure. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A circuit arrangement comprising a radio frequency (RF) switch circuit, the radio frequency switch circuit comprising:
a voltage divider circuit having an input terminal connected to a first line and an output terminal connected to a second line, the first line being connected to a power source for a supply voltage;
a semiconductor device having an activated state and a deactivated state, a gate terminal of the semiconductor device being connected to the second line of the voltage divider circuit in the activated state, a source terminal and a drain terminal of the semiconductor device each being selectively connected to ground and in the deactivated state, the source terminal and the drain terminal of the semiconductor device each being selectively connected to the power source, oxide direct current stress between the gate terminal and either or both the source terminal and the drain terminal being maintained below power handling limits of the semiconductor device in the deactivated state and the activated state based upon a direct current gate voltage reduced from the supply voltage by the voltage divider.

2. The circuit arrangement of claim 1, wherein the semiconductor device is a triple-well n-channel metal oxide semiconductor transistor.

3. The circuit arrangement of claim 1, wherein the source terminal of the semiconductor device is connected to radio frequency signal input line.

4. The circuit arrangement of claim 1, wherein the drain terminal of the semiconductor device is connected to a radio frequency signal output line.

5. The circuit assembly of claim 1 further comprising a resistive element connected to the semiconductor device and the output terminal of the voltage divider.

6. The circuit assembly of claim 5 wherein the resistive element is connected to the gate terminal of the semiconductor device.

7. The circuit assembly of claim 1 further comprising a first direct current blocking capacitor connected between the drain terminal of the semiconductor device and a radio frequency signal input.

8. The circuit assembly of claim 1 further comprising a second direct current blocking capacitor connected between the source terminal of the semiconductor device and a radio frequency signal output.

9. The circuit assembly of claim 1 wherein the deactivated state sets a radio frequency power handling limit based on parasitic diode clipping at a predefined level of induced radio frequency voltage.

10. The circuit assembly of claim 1 wherein the voltage divider reduces the supply voltage by half for output to the semiconductor device.

11. The circuit assembly of claim 10 wherein the supply voltage is 5 volts, and the direct current gate voltage is 2.5 volts.

12. The circuit assembly of claim 11 wherein the semiconductor device is a 3.3-volt device.

13. The circuit assembly of claim 1 wherein the voltage divider is a two-resistor voltage divider.

14. A method for configuring and operating a semiconductor switch for processing of radio frequency signals, comprising:
applying an input voltage over a first line to a voltage divider circuit;
applying an output voltage of the voltage divider over a second line to a gate terminal of a triple-well n-channel metal oxide semiconductor transistor, the output voltage of the voltage divider circuit always being above a threshold of the triple-well n-channel metal oxide semiconductor transistor to guarantee switch function, while oxide direct current stress between the gate terminal and either or both the source terminal and the drain terminal being maintained below power handling limits of the triple-well n-channel metal oxide semiconductor transistor in the deactivated state and the activated state based upon a direct current gate voltage reduced from the input voltage by the voltage divider circuit.

15. The method of claim 14 wherein when the triple-well n-channel metal oxide semiconductor transistor is in a deactivated state, a source terminal and a drain terminal of the triple-well NMOS transistor are each selectively connected to a power source, the power source being connected to the voltage divider circuit over the first line.

16. The method of claim 14 wherein when the triple-well n-channel metal oxide semiconductor transistor is in an activated state, a source terminal and a drain terminal of the triple-well n-channel metal oxide semiconductor transistor are each selectively connected to ground.

17. The method of claim 14 wherein the output voltage of the voltage divider is applied over the second line through a resistive element to the gate of the triple-well n-channel metal oxide semiconductor transistor.

18. The method of claim 14 wherein the deactivated state sets a radio frequency power handling limit based on parasitic diode clipping at a predefined level of induced radio frequency voltage.

19. A circuit assembly including a radio frequency switch circuit, the assembly comprising:
a gate resistor;

a voltage divider with an input connected to a power source generating a supply voltage and an output connected to the gate resistor; and a triple-well n-channel metal oxide semiconductor transistor with an activated state and a deactivated state, and including a gate, a source and a drain the gate being connected to the gate resistor and the source and the drain each being selectively connectable to ground to transition the triple-well n-channel metal oxide semiconductor transistor to the activated state and to the power source to transition the triple-well n-channel metal oxide semiconductor transistor to the deactivated state, oxide direct current stress between the gate and either or both the source and the drain being maintained below power handling limits of the triple-well n-channel metal oxide semiconductor transistor in the deactivated state and the activated state based upon a direct current gate voltage reduced from the supply voltage.

20. The circuit assembly of claim 19 wherein the voltage divider reduces the supply voltage by half for output to the semiconductor device.

\* \* \* \* \*